(12) United States Patent
Tsai et al.

(10) Patent No.: US 7,813,028 B2
(45) Date of Patent: Oct. 12, 2010

(54) MANUFACTURING METHOD FOR STRESS COMPENSATED X-Y GIMBALED MEMS MIRROR ARRAY

(75) Inventors: Chialun Tsai, Thousand Oaks, CA (US); Jeffrey F. DeNatale, Thousand Oaks, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 463 days.

(21) Appl. No.: 11/950,400

(22) Filed: Dec. 4, 2007

(65) Prior Publication Data

US 2008/0130081 A1 Jun. 5, 2008

Related U.S. Application Data

(60) Provisional application No. 60/872,961, filed on Dec. 4, 2006.

(51) Int. Cl.
*G02B 26/00* (2006.01)
(52) U.S. Cl. .............. 359/290; 359/224.1; 359/291; 359/900; 438/48; 438/50; 438/455
(58) Field of Classification Search ... 359/223.1–224.1, 359/290–292, 295, 298; 438/48, 50, 55, 438/107, 455
See application file for complete search history.

(56) References Cited

U.S. PATENT DOCUMENTS

| 6,121,112 | A  | * | 9/2000  | Sakaguchi et al. | 438/406 |
| 7,303,935 | B2 | * | 12/2007 | DeNatale et al.  | 438/48  |
| 7,358,102 | B2 | * | 4/2008  | Lee et al.       | 438/29  |
| 2003/0031939 | A1 | * | 2/2003 | Butschke et al.  | 430/5   |

* cited by examiner

*Primary Examiner*—James Phan
(74) *Attorney, Agent, or Firm*—Snell & Wilmer L.L.P.

(57) ABSTRACT

A wafer-level manufacturing method produces stress compensated x-y gimbaled comb-driven MEMS mirror arrays using two SOI wafers and a single carrier wafer. MEMS structures such as comb drives, springs, and optical surfaces are formed by processing front substrate layer surfaces of the SOI wafers, bonding together the processed surfaces, and removing the unprocessed SOI layers to expose second surfaces of the front substrate layers for further wafer-level processing. The bonded SOI wafers are mounted to a surface of the carrier wafer that has been separately processed. Processing wafer surfaces may include formation of a stress compensation layer to counteract physical effects of MEMS mirrors to be formed in a subsequent step. The method may form multi-layered conductive spring structures for the mirrors, each spring having a first conducting layer for energizing a comb drive, a second conducting layer imparting a restoring force, and an insulating layer between the first and second conducting layers.

14 Claims, 13 Drawing Sheets

MANUFACTURING METHOD FOR STRESS COMPENSATED X-Y GIMBALED MEMS MIRROR ARRAY

CLAIM OF PRIORITY UNDER 35 U.S.C. §119

The present Application for patent claims priority to U.S. Provisional Application No. 60/872,961 entitled "NOVEL X-Y GIMBALED MEMS MIRROR ARRAY DESIGN FOR OPTICAL SWITCHING," filed Dec. 4, 2006, and assigned to the assignee hereof and hereby expressly incorporated by reference herein.

BACKGROUND OF THE INVENTION

1. Field of the Invention

The present invention relates generally to microelectromechanical systems (MEMS), more specifically to manufacturing MEMS devices using silicon-on-insulator (SOI) substrates, and most specifically to manufacturing a gimbaled MEMS mirror array from SOI substrates for use in fiber optic switching.

2. Description of Related Art

Among the several technologies competing for acceptance in Optical Cross Connect (OXC) applications, MEMS-based micro-mirrors are regarded as the most promising technology. Typically, the micro-mirrors are arranged as an array (e.g. 8×8 or 16×16) of flat mirrors, each on the order of around 100 microns or more, each mounted on a rotatable section of semiconductor substrate. The array may be configured to selectively reflect optical signals received from a fiber optic channel. When voltage is applied to a particular electrode on the substrate, electrostatic forces cause a slight deflection or rotation of the micro-mirror, redirecting light information to another optical channel. The micro-mirrors may be fabricated as single-axis mirrors rotatable about one axis only, or as dual-axis gimbaled mirrors that are rotatable about two axes (x and y). In general, the dual-axis mirror has greater switching capability than the single-axis mirror, and may assume many more positions in a three-dimensional array (and reflect light to at least twice as many channels) as the single axis mirror.

Known methods of fabricating MEMS mirror arrays have utilized a single SOI wafer to realize dual-axis, double layered micro-mirror structures. Such design approaches require front side etching as well as back side through wafer etching processes on the same SOI wafer. One such fabrication method, known as the parallel plate method, uses etching and/or bonding techniques on an SOI wafer to create an actuator consisting of two planar electrodes displaced from and parallel to a planar mirror. Mirror arrays up to 1000×1000 are possible using the parallel plate method.

One example of a parallel plate device 10 is shown in FIG. 1. A planar mirror 11 is suspended by x-axis 12 and y-axis 13 on a substrate layer 14. Spacers 15 mounted on a substrate 18 displace mirror 11 from planar electrodes 16 and 17 to allow space for rotation of mirror 11. The mirror, axes, spacers, and electrodes are formed on an SOI wafer using deposition and/ or etching techniques. FIG. 2 shows a cross section of a conventional SOI wafer 20, which has a front substrate layer 21, a back substrate layer 22, and an insulation layer 23 between the two substrate layers.

There are many competing design factors that limit the effectiveness of the parallel plate design. One problem is that in order to gain switching capability by increasing the displacement angle of the mirror, either higher driving voltages must be applied to the electrodes, or the axis material (which acts as a spring) must be made extremely soft. Neither of these options is particularly desirable. Higher driving voltages raise power consumption, and softer springs render the device more susceptible to material failures. In general, a design tradeoff occurs whereby faster switching time is achieved by raising the driving voltage, and lower driving voltage is achieved at the expense of switching time. In the parallel plate design space, a driving voltage of 100 volts corresponds to a switching time of about 10 ms. A performance specification for a 1 ms switching time at a driving voltage of less than 100 volts is not achievable using a parallel plate solution.

An alternative design that uses comb-driven actuators can achieve superior performance characteristics. A comb driven, dual axis micro-mirror architecture is especially attractive for large scale optical switching systems due to its advantages of low optical insertion loss, large inter-channel isolation, fast switching speed, and low driving voltage. At the current state of the art, 3-D MEMS mirror arrays using comb-driven actuators for optical switching could achieve 1 ms switching times (1000 Hz) at well below 100 volts.

Such devices, however, are very difficult to fabricate. Comb-drive actuators have been fabricated using through-wafer processing techniques on both sides of an SOI wafer. Generally, through-wafer processing is an expensive fabrication technique that is associated with lower yield. In addition, through-wafer processing places structural limitations on comb and gap design that directly affect device performance. For example, the achievable comb finger density is not sufficient to produce a desirable fill factor or resonant frequency. Other factors also drive up production costs. For example, conductive wires must be bonded separately to the wafer to make the needed electrical connections. Low reliability due to stress-related failure is also a concern. Through-wafer processing does not allow for the fabrication of a stress compensation layer beneath a MEMS structure that is formed on an outer layer of the SOI wafer.

Effectively utilizing a double-sided deep silicon etching process, electrical interconnection techniques, and wafer level packaging are the major challenges for realizing sophisticated devices such as 3D MEMS mirror arrays. Market forces demand further development of a high performance, stress compensated dual-axis, low-power MEMS mirror array that may be realized through an inexpensive, high-yield, wafer-level manufacturing process.

SUMMARY OF THE INVENTION

The present invention provides a wafer-level manufacturing process for mass production of stress compensated x-y gimbaled comb-driven MEMS mirror arrays. A first embodiment of the method may be used to fabricate a MEMS structure from two SOI wafers and a single carrier wafer, each SOI wafer having front and back substrate layers separated by an insulation layer. The method may include the following steps: (a) processing a first surface of the front substrate layer of a first SOI wafer, (b) processing a first surface of the front substrate layer of a second SOI wafer, (c) bonding the processed first surface of the front substrate layer of the first SOI wafer to the processed first surface of the front substrate layer of the second SOI wafer, (d) removing the back substrate layer and the insulation layer from the second SOI wafer to expose a second surface of the front substrate layer of the second SOI wafer, (e) processing the exposed second surface of the front substrate layer of the second SOI wafer, (f) processing a first surface of a carrier wafer, (g) bonding the processed second surface of the front substrate layer of the second SOI wafer to the processed first surface of the carrier wafer, (h) removing the back substrate layer and the insulation layer from the first SOI wafer to expose a second surface of the front substrate layer of the first SOI wafer, and (i) processing the exposed second surface of the front substrate layer of the first SOI wafer. Depending on the function and formation of a desired end product, the various processing steps may include one or more or a combination of deposition, patterning, etching, bonding, and polishing steps for creating conductive and/or insulation layers. In particular, processing step (a) may include depositing a stress compensation layer to counteract physical effects of a MEMS structure to be formed on the device in a subsequent step.

A second embodiment of the method may be used to fabricate a MEMS device having a stress-compensation layer using two SOI wafers, each SOI wafer having front and back substrate layers separated by an insulation layer. The method may include the following steps: (a) depositing a compensating layer of material on a first surface of the front substrate layer of a first SOI wafer, (b) processing a first surface of the front substrate layer of a second SOI wafer, (c) bonding the first surface of the front substrate layer of the first SOI wafer to the processed first surface of the front substrate layer of the second SOI wafer, (d) removing the back substrate layer and the insulation layer from the first SOI wafer to expose a second surface of the front substrate layer of the first SOI wafer, and (e) depositing a MEMS structure on the exposed second surface of the front substrate layer of the first SOI wafer so that a stress introduced by the MEMS structure on the device is compensated by the compensating layer. The deposited compensating layer may be a conductive layer or one or more optical coatings, may have a mass substantially equivalent to the mass of the compensating layer, or may cover a surface area substantially equivalent to the surface area covered by the compensating layer.

A third embodiment of the method may be used to fabricate a conductive spring structure on a MEMS device using two SOI wafers, each SOI wafer having front and back substrate layers separated by a first insulation layer. The method may include the following steps: (a) depositing a second insulation layer on a first surface of the front substrate layer of a first SOI wafer, (b) depositing a conductive layer on the second insulation layer, (c) processing a first surface of the front substrate layer of a second SOI wafer, (d) bonding the deposited conductive layer of the first SOI wafer to the processed first surface of the front substrate layer of the second SOI wafer, (e) removing the back substrate layer and the first insulation layer from the first SOI wafer to expose a second surface of the front substrate layer of the first SOI wafer, and (f) processing the exposed second surface of the front substrate layer of the first SOI wafer. The spring may be formed by an etching technique such as two-mask etching, and may be a multi-layered spring having a first conducting layer formed from the front substrate layer of the first SOI wafer, a second conducting layer formed from the deposited conductive layer, and an insulating layer between the first conducting layer and the second conducting layer, where the insulating layer is formed from the deposited second insulation layer.

A gimbaled MEMS optical switching device according to the invention includes a comb drive formed from a substrate, a spring structure having (a) a first conducting layer energizing the comb drive, (b) a second conducting layer formed from the substrate, and (c) an insulating layer between the first conducting layer and the second conducting layer, and an optical element bonded to the substrate and rotatable about an axis responsive to energization of the first conducting layer, wherein the second conducting layer imparts a restoring force on the optical element responsive to rotation of the optical element.

BRIEF DESCRIPTION OF THE DRAWINGS

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. Component parts shown in the drawings are not necessarily to scale, and may be exaggerated to better illustrate the important features of the invention. In the drawings, like reference numerals designate like parts throughout the different views, wherein:

DETAILED DESCRIPTION OF THE INVENTION

The following disclosure presents exemplary embodiments of the invention for wafer-level manufacturing of MEMS devices. The fabrication processes presented herein may be used to manufacture a variety of MEMS structures using SOI wafers, and are particularly well-suited for fabricating mirror arrays for applications such as optical switching. An exemplary process according to the invention processes multiple surfaces on multiple SOI wafers and bonds the SOI wafers to a carrier wafer produce a comb-driven x-y gimbaled MEMS mirror array having structural and performance characteristics far superior to anything realized in the prior art. These characteristics may include a device layer well under 100 μm thick, a thick carrier support layer of about 1 mm, high fill factor, high comb density, high resonant frequency, and an approximate 1 ms response time at a driving voltage of about 10 volts. Such a device may be achieved using commercially available carrier and SOI wafers and the fabrication steps as herein described.

Micro-Mirror Design

Figure 1:
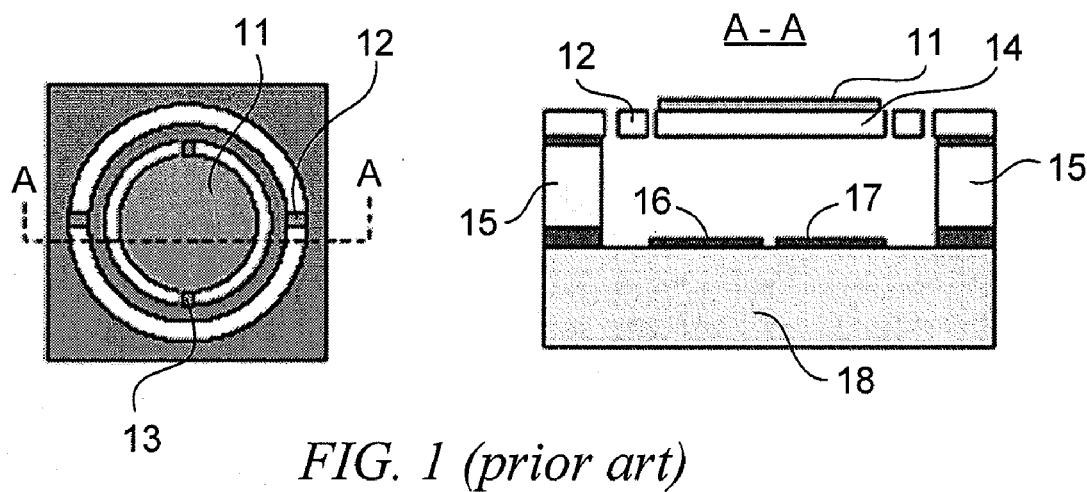
FIG. 1 shows top and cross sectional views of a prior art MEMS mirror device having a parallel plate actuator.
Figure 2:
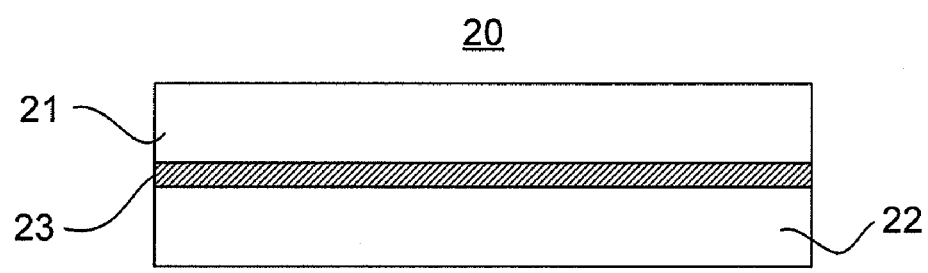
FIG. 2 is a cross sectional view of a conventional SOI wafer.
Figure 3:
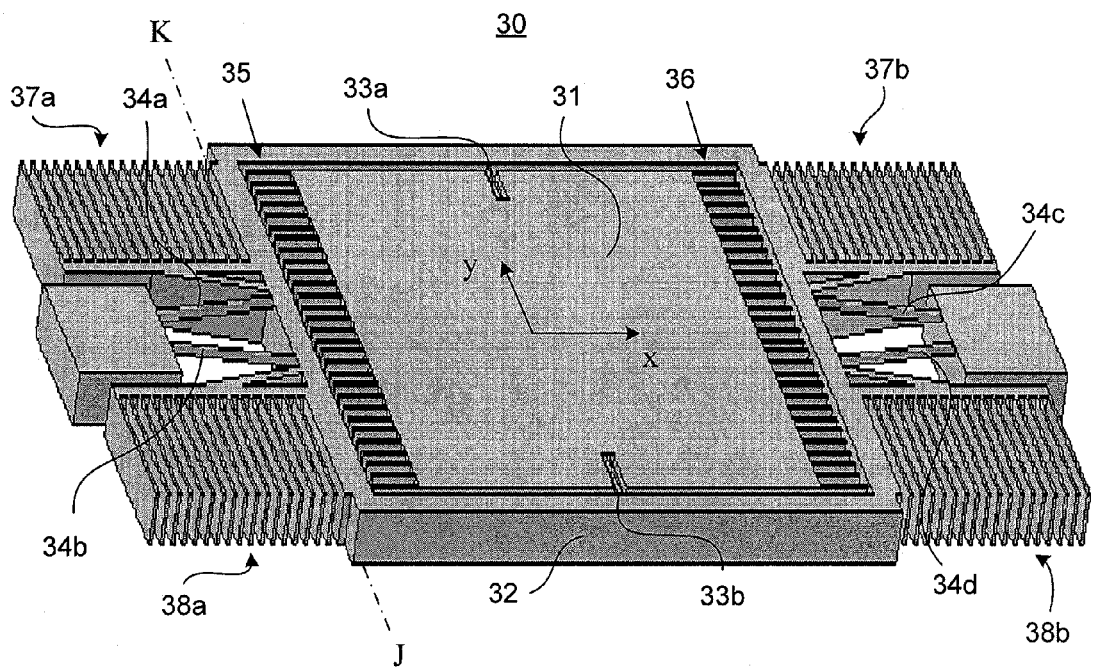
FIG. 3 is a top isometric drawing of one embodiment of a first device layer of a comb-driven x-y gimbaled MEMS mirror device manufactured according to a method of the present invention.

FIG. 3 shows a single segment 30 of an x-y gimbaled comb-driven MEMS mirror array fabricated on a first device layer according to the invention. Segment 30 includes an optical surface 31 formed from a wafer substrate. Optical surface 31, which may include a micro-mirror or a micro-mirror layer for reflecting optical signals, is suspended within a frame 32 by springs 33a and 33b. Springs 33a and 33b allow optical surface 31 limited rotation about the y-axis within frame 32. Springs 34a, 34b, 34c, and 34d suspend frame 32 in a gimbaled arrangement to allow optical surface 31 limited rotation about the x-axis. Either of comb drives 35 and 36 may be energized to cause a deflection of surface 31 about the y-axis, and either pair of comb drives 37a, 37b and 38a, 38b may be energized to cause a deflection of surface 31 about the x-axis. Frame 32, springs 33a, 33b, 34a, 34b, 34c, 34d, and comb drives 35, 36, 37a, 37b, 38a and 38b may all be formed at least partially from the same substrate as surface 31. Frame 32 and comb drive sections 37a, 37b, 38a and 38b may be held at the same potential, for example, at signal ground.

Each comb drive 35, 36, 37a, 37b, 38a and 38b has a plurality of teeth, as shown, and forms an upper half of a comb drive pair. The lower half of each comb drive pair (FIG. 4) has approximately the same number of teeth as the upper half, preferably arranged in an interleaved configuration to prevent interference between combs so that the teeth of one may rotate freely between the teeth of the other. For rotation of the optical surface 31 about either axis, the driving force is caused by presenting a potential difference between the halves of any comb drive pair. For this purpose, conductive traces (not shown) connect the combs to an external source of electrical energy. One trace formed through a carrier wafer 28 (FIG. 5) may connect conductive block 43 and comb drive 45 to a signal voltage V++. An another trace formed through the carrier wafer 28 may connect conductive block 44 and frame 32 to signal ground. Other traces may be provided to electrically connect comb drives 47a and 48a to establish a desired potential difference between upper and lower halves of the comb drive pairs. Segment 30 may be one of many segments that together form an optical switch having an array of many segments that are electrically interconnected. One exemplary array fabricated according to the invention comprises a rectangular array of 16×16 mirrored segments. Other sizes and configurations of mirrored arrays are possible within the scope of the invention.

Figure 4:
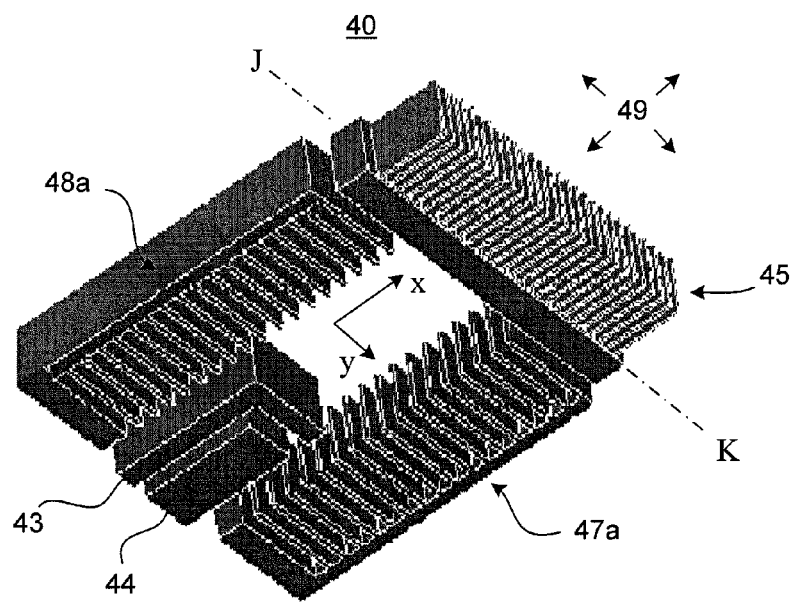
FIG. 4 is a bottom isometric drawing of one embodiment of a second device layer of a comb-driven x-y gimbaled MEMS mirror device manufactured according to a method of the present invention.

FIG. 4 shows a bottom view of segment 40 of an x-y gimbaled comb-driven MEMS mirror array fabricated on a second device layer according to the invention. The second device layer interacts with and lies just underneath the first device layer, such that the J-K axis of segment 40 aligns with the J-K axis of segment 30. A comb drive 45 on segment 40 interacts with comb drive 35, and serves as the lower half of that comb drive pair. Comb drives 47a and 48a on segment 40 interact, respectively, with comb drives 37a and 38a, and serve as the lower halves of those comb drive pairs. When comb drives are energized, segment 40 remains stationary relative to segment 30. Deflection of optical surface 31 along either the x-axis or y-axis causes displacement of surface 31 into space 49. Space 49 is a voided area formed, for example, by etching substrate material from the second device layer directly beneath optical surface 31. Comb drives 45, 48a and 48b may all be formed at least partially from the same substrate of the second device layer. Additional segments (not shown) substantially similar to segment 40 may also be formed on the second device layer to interact with other comb drives on the first device layer of the mirror array.

The first device layer may be bonded to the second device layer, and the second device layer may be bonded to a third layer (or carrier layer) that serves as a supporting substrate. According to the invention, each layer may be processed at the wafer level without using through-level processing. This process provides independent access to device surfaces for deposition and patterning of isolation coatings and metallization to form necessary electrical connections to each isolated comb drive. For stress compensation across a wide temperature range, both sides of the optical elements may be coated and patterned with matching metal. In one application of this technique, a micro-mirror array may be designed with high fill factor for each optical element, each element having a pitch of about 500 μm, and with the array having a gap between mirrors of only about 10 μm.

Fabrication

The OXC mirrors may be fabricated by a novel two-layer device transfer technique through a series of deposition, patterning, bonding, and substrate removal processes. These processes are described herein as a series of manufacturing steps that may be performed using commercially available silicon-substrate wafers. In the following exemplary embodiments, pre-formed layered wafers such as SOI wafers may be used in the fabrication. For example, the SOI wafer may have two silicon-based substrates separated by a layer of insulation such as silicon dioxide. The thickness of each layer may vary according to the desired form and application of the end product.

Figure 5:
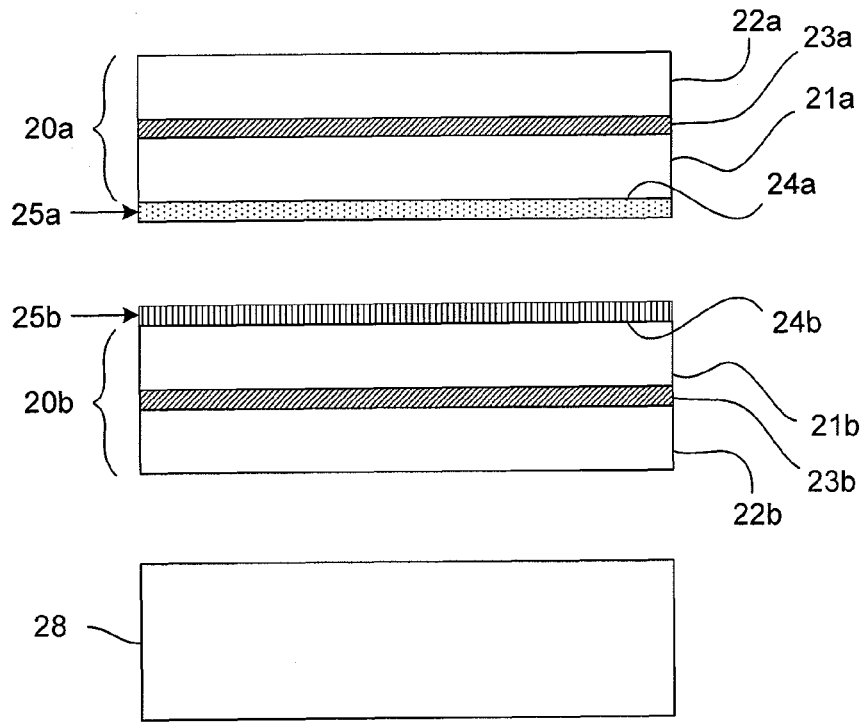
FIG. 5 shows cross sectional views of two SOI wafers and one carrier wafer to illustrate a process step in a method according to the invention for wafer level manufacturing of a MEMS device.

FIG. 5 shows cross sectional views of two SOI wafers and one carrier wafer to illustrate a first process step in a method according to the invention for wafer level manufacturing of a MEMS device. Provided for fabrication are a first SOI wafer 20a for fabricating a first device layer, a second SOI wafer 20b for fabricating a second device layer, and a carrier wafer 28 for fabricating a third layer that serves as a supporting substrate and a convenient location for making electrical connections. First SOI wafer 20a includes a front substrate layer 21a, a back substrate layer 22a, and an insulation layer 23a between the two substrate layers. Second SOI wafer 20b includes a front substrate layer 21b, a back substrate layer 22b, and an insulation layer 23b between the two substrate layers. Carrier wafer 28 may include one or more layers of material. In one embodiment, carrier wafer 28 has a single conductive layer such as a layer formed from a silicon substrate. In another embodiment, carrier wafer 28 has a single insulating layer such as a layer of glass, ceramic, or quartz material.

Throughout this disclosure, the term "processing" in the context of forming a wafer layer includes, but is not limited to coating a layer with insulating or conductive material using a deposition process, patterning a layer using a masking or etching process, preparing the layer for bonding by depositing bond pads such as gold bond pads onto the surface of a layer, and removal of material from or complete removal of one or more layers of a wafer.

The process starts by processing a first surface 24a of the front substrate layer 21a of first wafer 20a. Formation or partial formation of the various structures (optical surface, frame, springs, comb drives, etc.) of a first device layer of a device such as MEMS device 30 may be accomplished in this step. A deposition of a stress compensating layer of material may also be performed in this step to realize a significant advantage of the present invention. The stress compensating layer may comprise a conductive layer or one or more optical coatings or other material suitable for providing stress compensation to counteract physical effects of an optical element that is to be later formed or deposited on an opposite side of layer 21a, as will be fully described in the steps that follow. Thus, in the first step, the first surface 24a may be processed to form process layer 25a by coating surface 24a with an insulating layer such as a silicon oxide layer, and/or etching to form patterns or recesses defining an array of devices and/or device structures, and/or provided with a stress compensation layer, bonding pads and/or electrical contacts by means of a deposition technique.

In another step which may be performed in parallel with or sequentially to the first step, a first surface 24b of the front substrate layer 21b of second wafer 20b may be similarly processed to form a process layer 25b, including coating with an insulating layer, patterning, and/or deposition of bonding pads. Formation or partial formation of comb drive or other structures of a second device layer may be accomplished in this parallel or sequential step.

Figure 6:
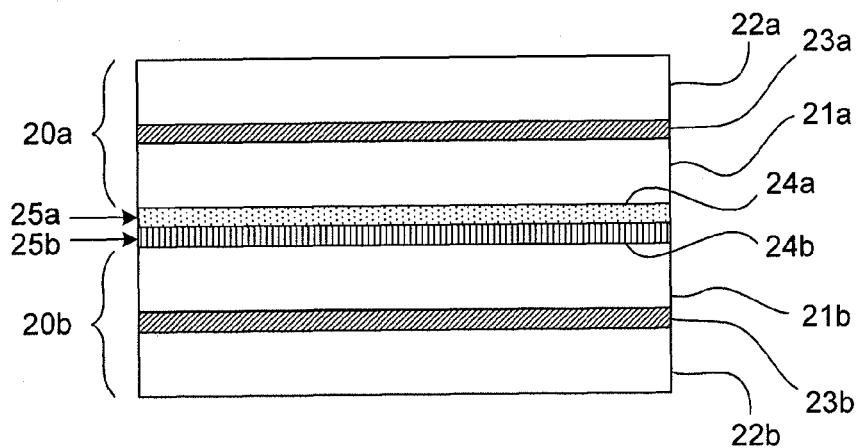
FIG. 6 shows a cross sectional view of first and second SOI wafers to illustrate a process step for bonding the wafers in a method according to the invention for manufacturing of a MEMS device.
Figure 7:
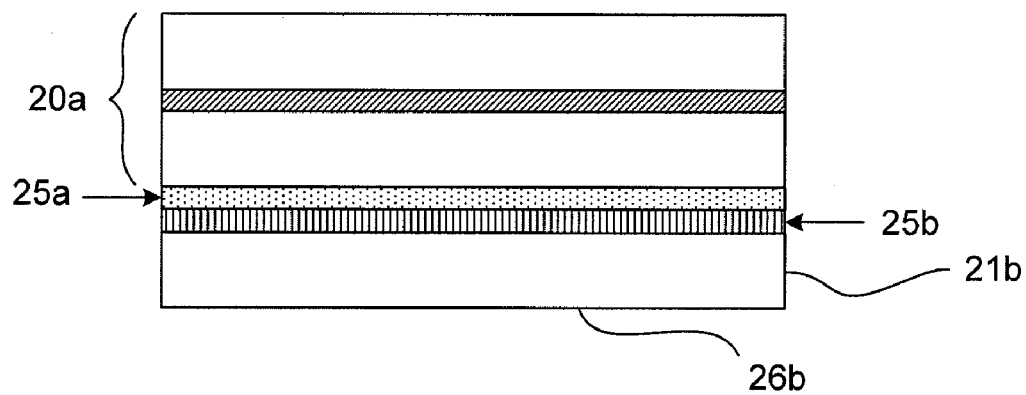
FIG. 7 shows a cross sectional view of the layers of FIGS. 3 & 4 to illustrate a process step for removing wafer layers in a method according to the invention for manufacturing a MEMS device.
Figure 8:
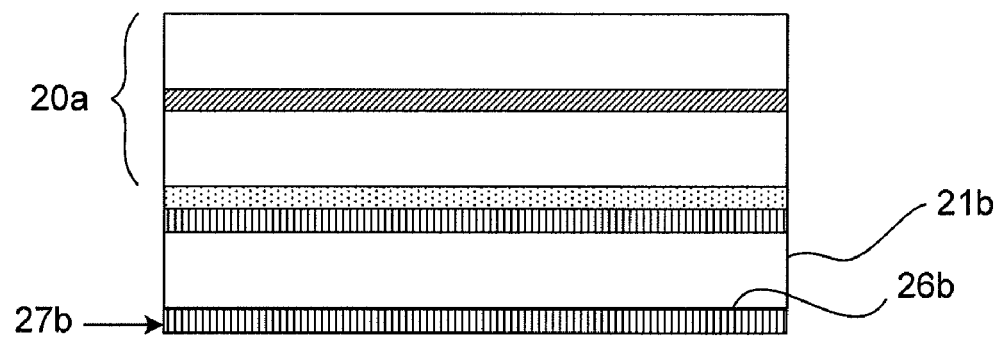
FIG. 8 shows a cross sectional view of the wafers of FIG. 7 to illustrate a step for further processing a wafer layer in a method according to the invention for manufacturing a MEMS device.

FIG. 6 illustrates the next process step. In this step, SOI wafers 20a and 20b are bonded together at their bonding pads, for example, through an Au—Au thermal-compression bond process. The result of this step is a bonding of the SOI wafers so that layer 24a of wafer 20a lies adjacent to layer 24b of wafer 20b. In the next step depicted in FIG. 7, back substrate layer 22b and insulation layer 23b are shown removed from second SOI wafer 20b. Removal of these layers may be performed by a polishing technique. At the conclusion of this step, a second surface 26b of the front substrate layer 21b of wafer 20b is exposed to allow for further processing of the front substrate layer 21b. FIG. 8 illustrates the next step, in which the second surface 26b is processed to form a process layer 27b by deposition, patterning, and/or bonding preparation. Formation or partial formation of comb drive or other structures of the second device layer may be accomplished in this step.

Figure 9:
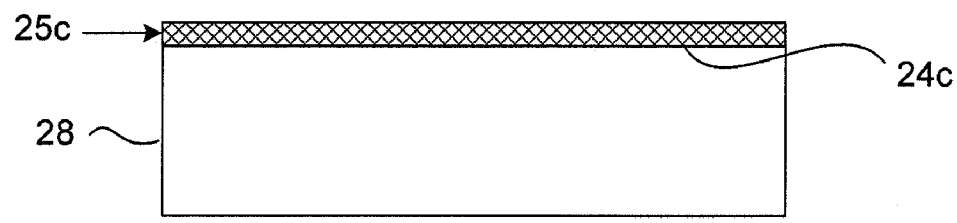
FIG. 9 shows a cross sectional view of a third (carrier) wafer to illustrate a step for further processing a wafer layer in a method according to the invention for manufacturing a MEMS device.

FIG. 9 depicts the next step of the process, which is a step for processing the carrier wafer 28. This step may be carried out independently of previous steps performed on wafers 20a and 20b. As such, this step may be performed in parallel with the foregoing steps, or elsewhere in the manufacturing sequence. In this step, a first surface 24c of carrier wafer 28 may be processed to form a process layer 25c. This processing may include formation of an insulating layer, patterning of recesses, and/or deposition of bonding pads and electrical contacts. In one embodiment in which wafer 28 is formed from a single conductive layer, the process layer 25c may represent multiple processing steps. These may include forming an insulation (or isolation) layer by a deposition technique, then patterning and etching the insulation layer to achieve a desired configuration. For example, the conductive carrier layer may function as a common electrical ground, and may require formation of a plurality of insulated conduction paths at surface 24c for coupling to structures in the first and second device layers. Electrical wires may also be connected in this step for mirror actuation, and connecting pads may be formed for coupling to IC driving or sensing circuits. Electrically conductive bond metals may be added to connect wafer 28 to the first and second device layers. And finally, a recess region (see area 49 below) may be formed in surface 24c to allow the optical mirrors to rotate without contacting the carrier substrate.

Figure 10:
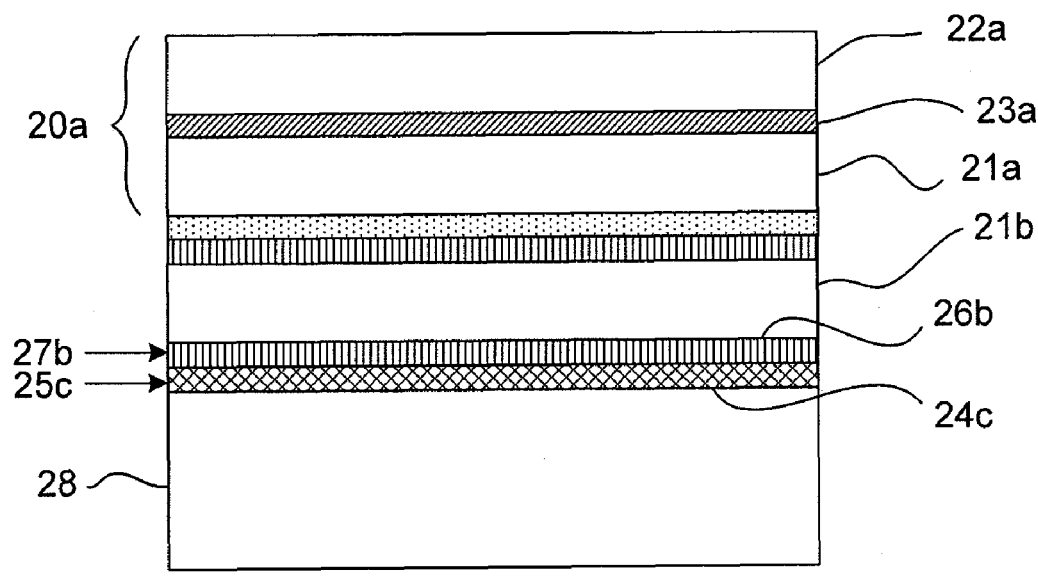
FIG. 10 shows a cross sectional view of two processed SOI wafers bonded to a processed carrier wafer to illustrate a process step for bonding the wafers in a method according to the invention for manufacturing a MEMS device.

FIG. 10 illustrates a process step for bonding the carrier wafer 28 to the bonded first and second wafers 20a and 20b. In this step, the bonding pads on surfaces 24c are aligned with the bonding pads on surface 26b, and the wafers bonded, for example, by a thermal-compression bond process. The result of this step is a bonding of SOI wafers so that layer 25c of wafer 28 lies adjacent to layer 27b of wafer 20b, as shown. Carrier wafer 28 may now provide a convenient means for handling the bonded wafers to allow for further processing of wafer 20a.

Figure 11:
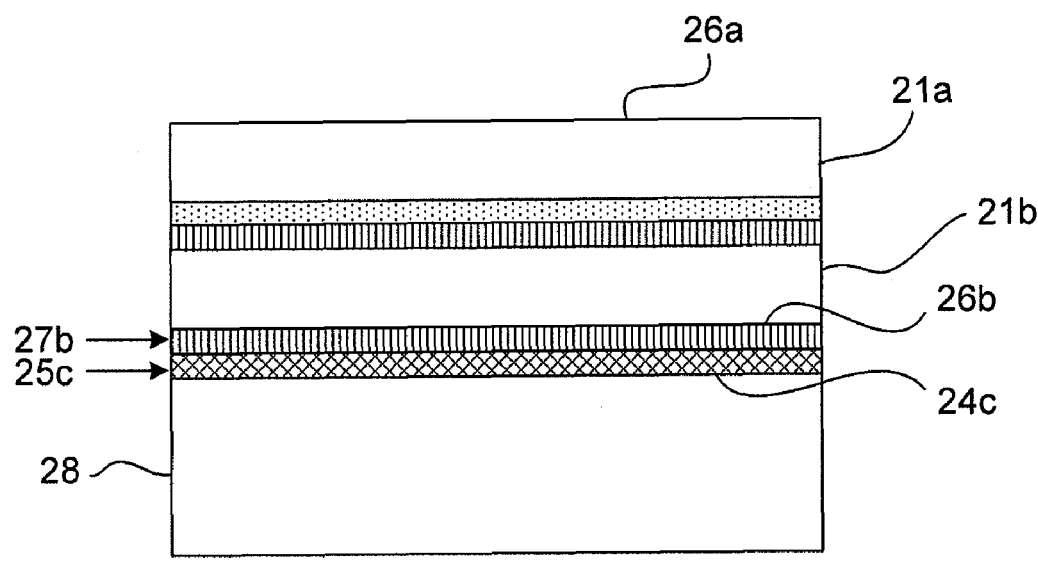
FIG. 11 shows a cross sectional view of the wafers of FIG. 10 to illustrate a process step for removing wafer layers in a method according to the invention for manufacturing a MEMS device.
Figure 12:
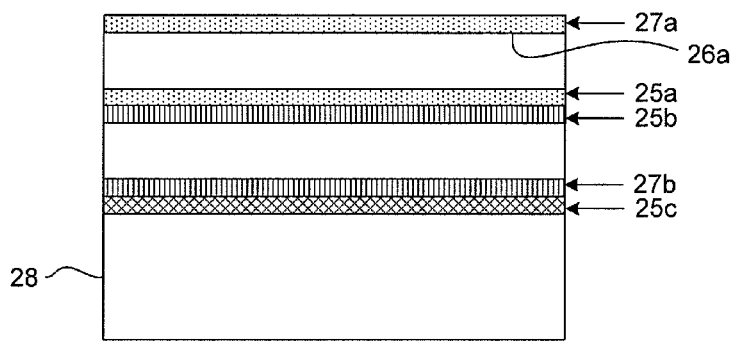
FIG. 12 shows a cross sectional view of the wafers of FIG. 11 to illustrate a step for further processing a wafer layer in a method according to the invention for manufacturing a MEMS device.

FIG. 11 illustrates the end result of the next process step, in which back substrate layer 22a and insulation layer 23a are shown removed from first SOI wafer 20a. Removal of these layers may be performed by a polishing technique. At the conclusion of this step, a second surface 26a of the front substrate layer 21a of wafer 20a is exposed to allow for further processing of the front substrate layer 21a. FIG. 12 illustrates the final step, in which the second surface 26a is processed to form a process layer 27a by deposition, patterning, and/or bonding preparation. Formation or partial formation of comb drive or other structures of the first device layer may be accomplished in this step. In particular, the final step may include deposition of, or attachment of, a MEMS structure such as mirror to form an optical surface. In one embodiment, the mirror may be formed by deposition of gold or other metal onto surface 26a. Advantageously, at this step a stress compensation layer may have already been formed in layer 25a on the opposite surface 24a to counteract the physical effects of the MEMS structure.

Additional combinations of layers are possible within the scope of the invention beyond those shown in the afore-described figures. Moreover, additional manufacturing steps outside the scope of the invention may be performed on the combined structure of the carrier wafer bonded to the first and second device layers according to the invention. For example, these additional steps may include one or more finishing processes, such as coating with resist, dicing, and dry release under O2 plasma.

Figure 13:
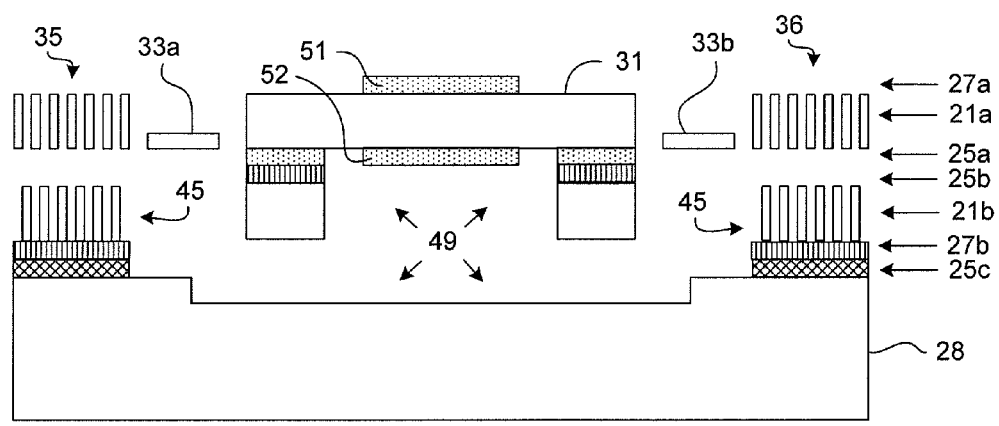
FIG. 13 shows a modified cross sectional view of one example of layer structures in a MEMS device manufactured according to the invention.

FIG. 13 shows a modified cross sectional view of one example of layer structures in a MEMS device manufactured according to the invention. This view is shown for purposes of illustrating a layer-by-layer construction of the MEMS device, and does not represent a specific cross section taken from any particular view. Optical surface 31 coincides with the second surface 26a of front substrate layer 21a. Layer 21a alone or in combination with one or more portions of layers 25a and 27a may form structures on the first device layer such as springs 33a, 33b, comb drives 35, 36 and electrical conduction paths thereto. Layer 21b alone or in combination with one or more portions of layers 25b and 27b may form structures on the second device layer such as comb drive 45 and electrical conduction paths thereto. Layer 25c may form insulation and/or conduction paths for energizing one or more of the comb drives, and carrier wafer 28 may provide an underlying support structure for the MEMS device.

A MEMS mirror structure 51 is shown deposited onto optical surface 31. A stress compensating structure or layer 52 is shown deposited onto first surface 24a of front substrate layer 21a such that it generally opposes mirror structure 51. Stress compensating layer 52 may be formed from process layer 25a or during the processing step for forming that layer. In one embodiment, the compensating layer 52 may be a conductive layer. In another embodiment, compensating layer 52 may be one or more optical coatings. In another embodiment, compensating layer 52 may have a total mass substantially equivalent to total mass of the mirror structure 51. In another embodiment, compensating layer 52 covers a total surface area substantially equivalent to the total surface area covered by the mirror structure 51.

Springs 33a and 33b are shown having a height less than other structures formed from substrate layer 21a. The height variation may be achieved in a process step by a two-mask etching technique. Voided area 49 may be also be formed by two-mask etching, or from single mask etching, in one or more of layers 25a, 25b, 21b, 27b, 25c and 28.

Figure 14:
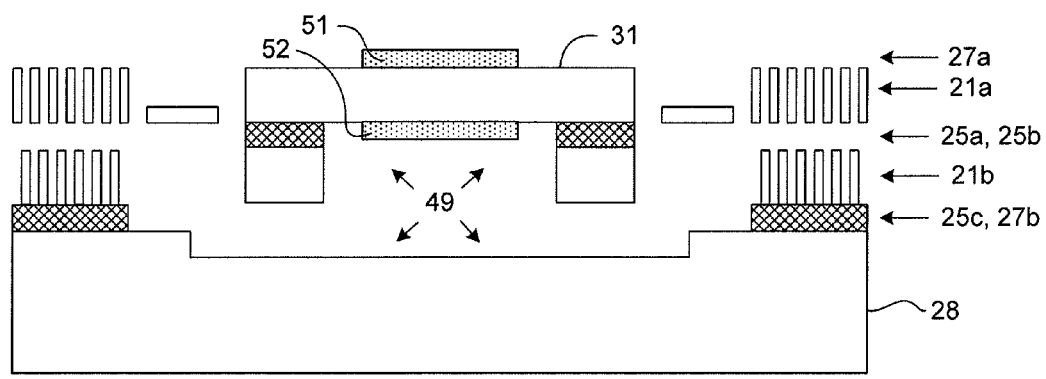
FIG. 14 shows a modified cross sectional view of another example of layer structures in a MEMS device manufactured according to the invention.

FIG. 14 shows a modified cross sectional view of another example of layer structures in a MEMS device manufactured according to the invention. FIG. 14 is provided for illustration only and does not represent a specific cross section taken from any particular view. In this embodiment, adjacent layers 25a and 25b are shown combined into a single layer resulting, for example, from a bonding process. The same is shown for adjacent layers 25c and 27b.

Figure 15:
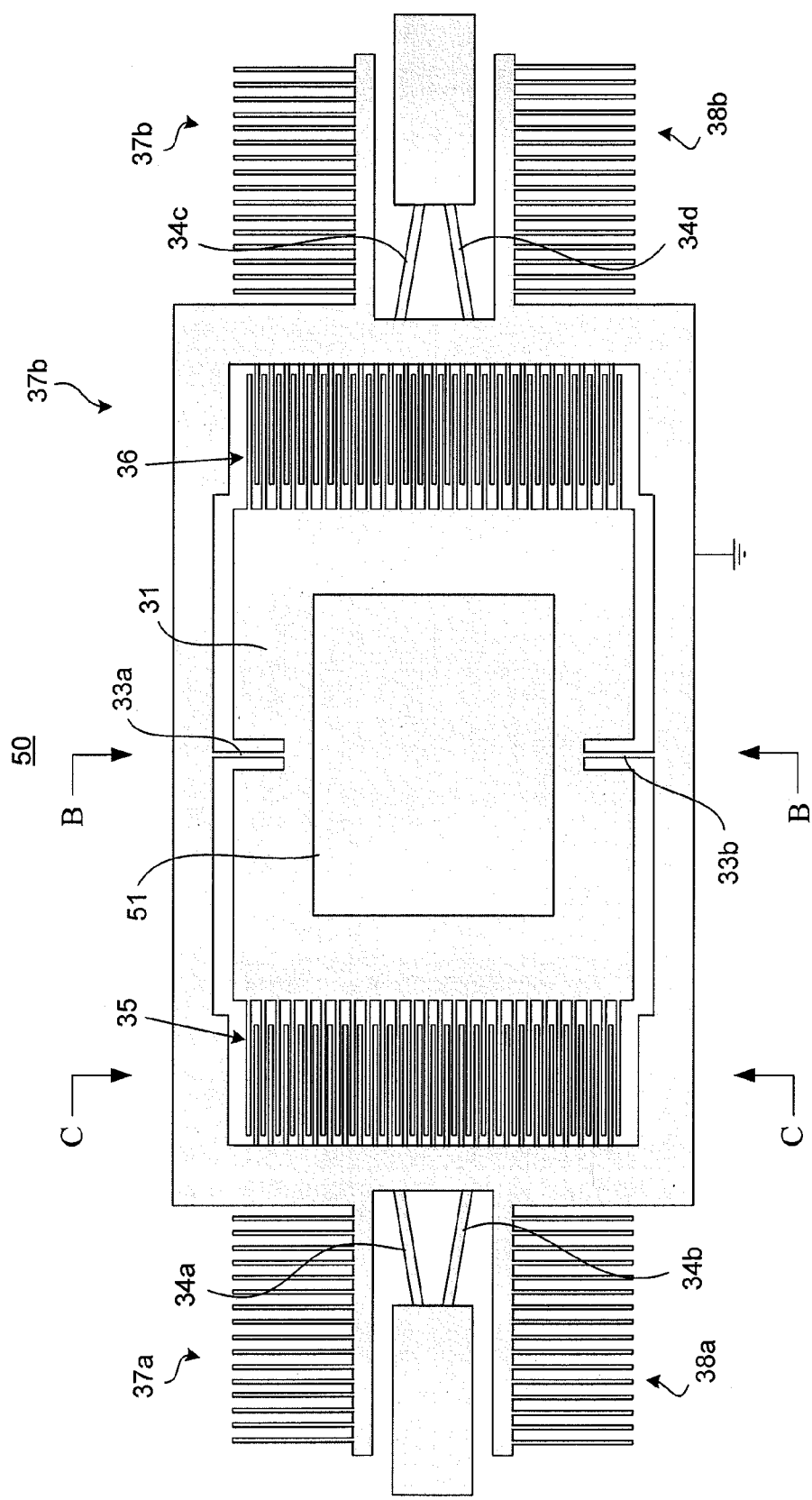
FIG. 15 shows a top view of one segment of a comb-driven x-y gimbaled MEMS mirror device manufactured according to a method of the invention.

FIG. 15 shows a top view of one segment 50 of a comb-driven x-y gimbaled MEMS mirror device manufactured according to a method of the present invention. Segment 50 includes a mirror 51 mounted on an optical surface 31, as well as the other major structural components as described in the embodiment of FIG. 3. The interleaved spatial relationship of the lower comb drive teeth of the second device layer with respect to the upper comb drive teeth of the first device layer are also shown in this figure.

Figure 16:
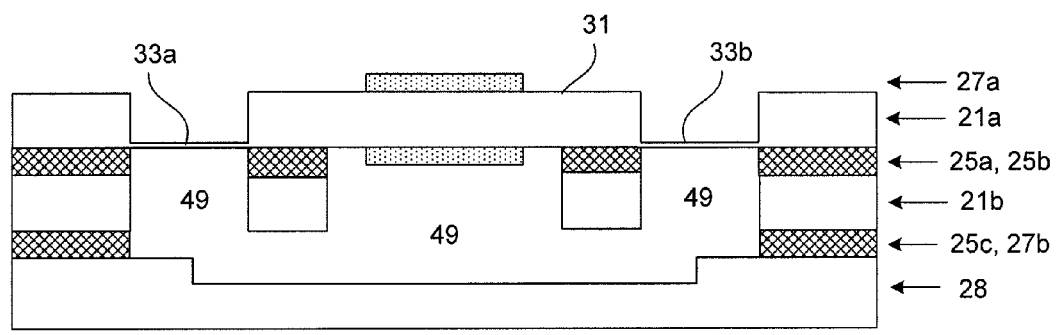
FIG. 16 shows a cross sectional view of the MEMS device of FIG. 15 taken along line B-B.

FIG. 16 shows a cross sectional view of the MEMS device of FIG. 15 taken along line B-B of FIG. 15. This view illustrates one exemplary pattern achieved through a method according to the invention. Springs 33a and 33b are formed by a two-mask etching technique that etches away substrate material surrounding each spring while leaving sufficient material to form the structure of each spring. This view also illustrates the etched away area 49 that allows free deflection of mirrored surface 31 about its rotational axes.

Figure 17:
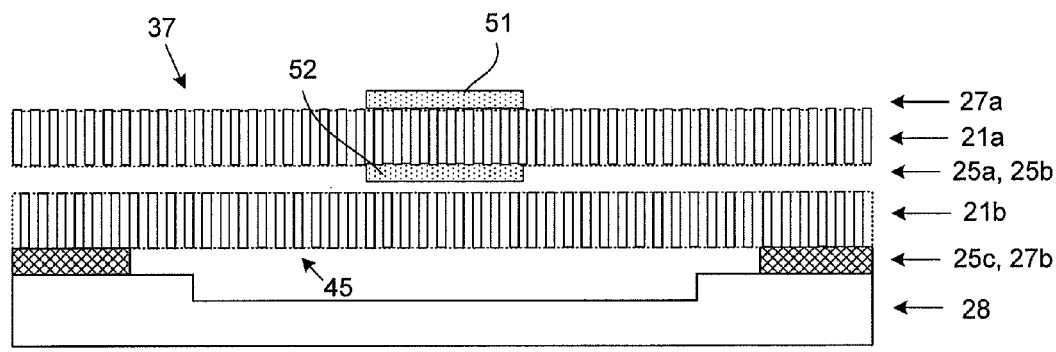
FIG. 17 shows a cross sectional view of the MEMS device of FIG. 15 taken along line C-C.

FIG. 17 shows a cross sectional view of the MEMS device of FIG. 15 taken along line C-C. This view illustrates an etching pattern for achieving upper and lower teeth of a comb drive structure. Comb drive 37 may be formed from the first device layer by etching substrate layer 21a. Comb drive 45 may be formed from the second device layer by etching substrate layer 21b. Structures such as comb drives 37a, 37b, 38a, and 38b are achieved in similar fashion.

Figure 18:
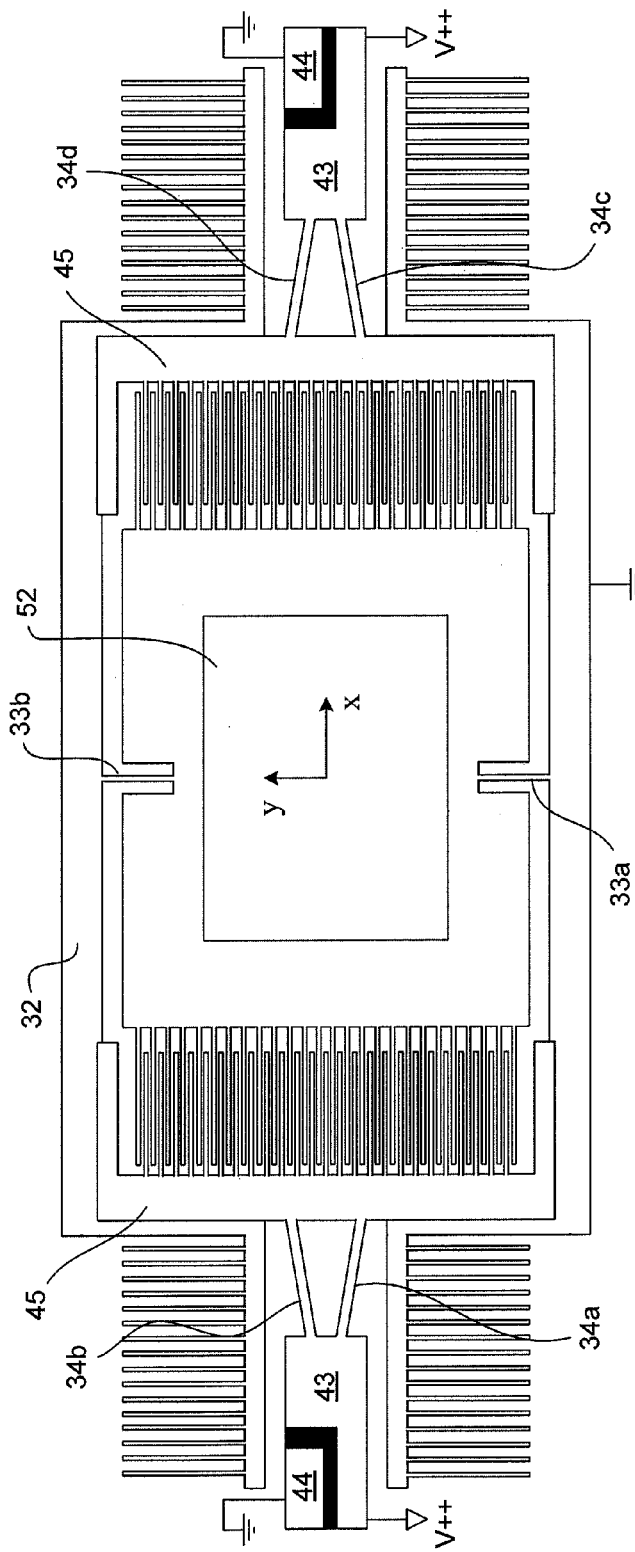
FIG. 18 shows a bottom view of the MEMS device of FIG. 15.

FIG. 18 shows a bottom view of the MEMS device of FIG. 15, looking up at the second device layer. Stress compensating layer 52 and lower comb drive structures 45 are shown with respect to the first device layer. Springs 34a, 34b, 34c, and 34d are shown coupled to lower comb structures 45. Conductive block 43 is shown coupled to signal voltage V++, and frame 32 and conductive block 44 are shown coupled to signal ground.

Figure 19:
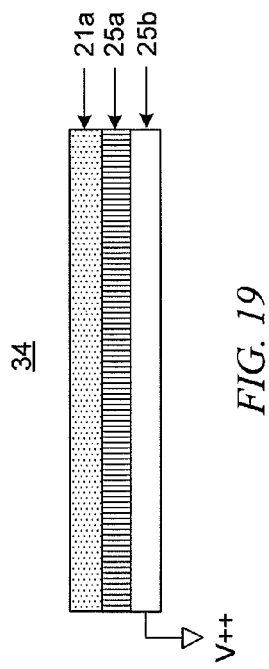
FIG. 19 is a cross sectional view of a multi-layered spring structure for the MEMS device of FIG. 15 manufactured according to a method of the invention.

Using wafer level processing according to the invention, it is possible to fabricate springs having multiple layers of material. FIG. 19 is a cross sectional view of a multi-layered spring structure 34 for the MEMS device of FIG. 15. A top layer of spring 34 may be formed from a deposition layer, or from a substrate such as substrate layer 21a. An intermediate layer of spring 34 may be formed from a deposition layer such as layer 25a. A bottom layer of spring 34 may be formed from a second substrate layer, or from a deposition layer such as layer 25b. In one embodiment, the top layer of spring 34 is formed from substrate and is electrically connected to ground, the intermediate layer is formed from a deposited layer of insulation to electrically isolate the top layer from the bottom layer, and the bottom layer is formed from a deposited layer of a conductive material that is electrically interconnected to a comb drive structure 45. The layered spring structure 34 is therefore able to provide a desired mechanical suspension for optical surface 31 by means of its top layer, as well as a conduction path for electrical energization of a comb drive 45 by means of its bottom layer. This design is not practical using through-wafer processing, and advantageously obviates the need for separate connection of conductive wires to the MEMS device.

Considered collectively, FIGS. 15-19 illustrate an embodiment of a gimbaled MEMS optical switching device according to the invention, the device having a comb drive (e.g. 45) formed from a substrate, a spring structure (e.g. 34a, 34b, 34c, 34d) and an optical element (e.g. 51) bonded to the substrate. The spring structure may include a first conducting layer (e.g. 25b) for energizing the comb drive, a second conducting layer (e.g. 21a) formed from the substrate, and an insulating layer (e.g. 25a) between the first conducting layer and the second conducting layer. In this configuration, the optical element is rotatable about an axis (e.g. the y-axis) responsive to energization of the first conducting layer, and the second conducting layer can impart a restoring force on the optical element responsive to rotation of the optical element.

Figure 20:
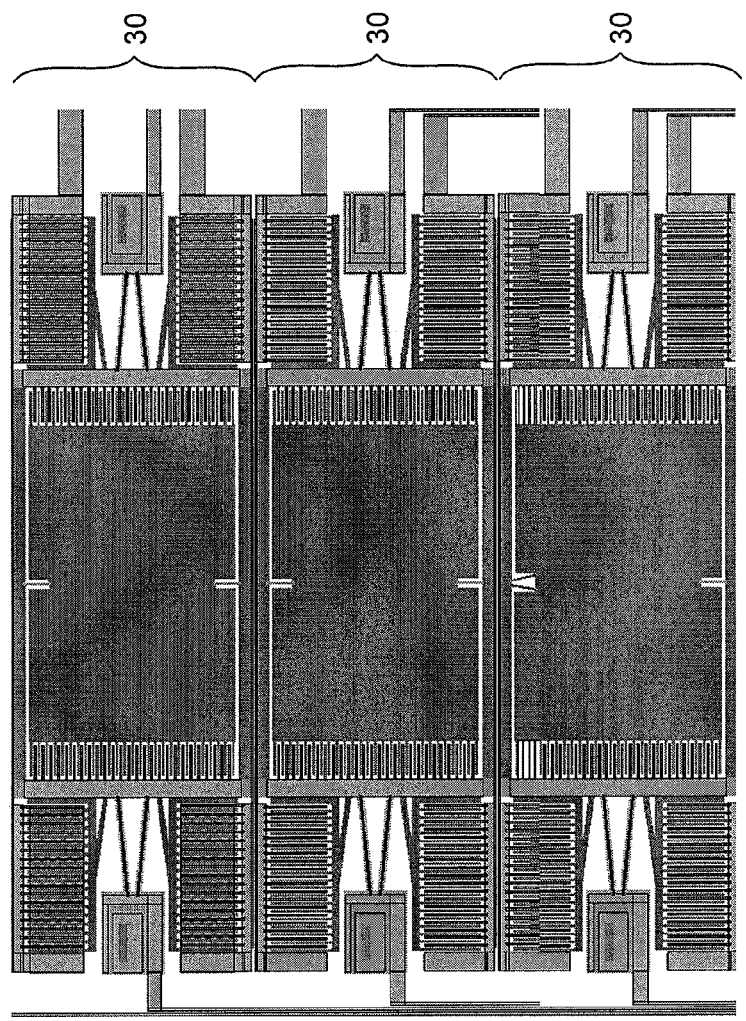
FIG. 20 is a top view of an array of multiple comb-driven x-y gimbaled MEMS mirror devices manufactured from two SOI wafers bonded to a carrier wafer according to a method of the invention.
Figure 21:
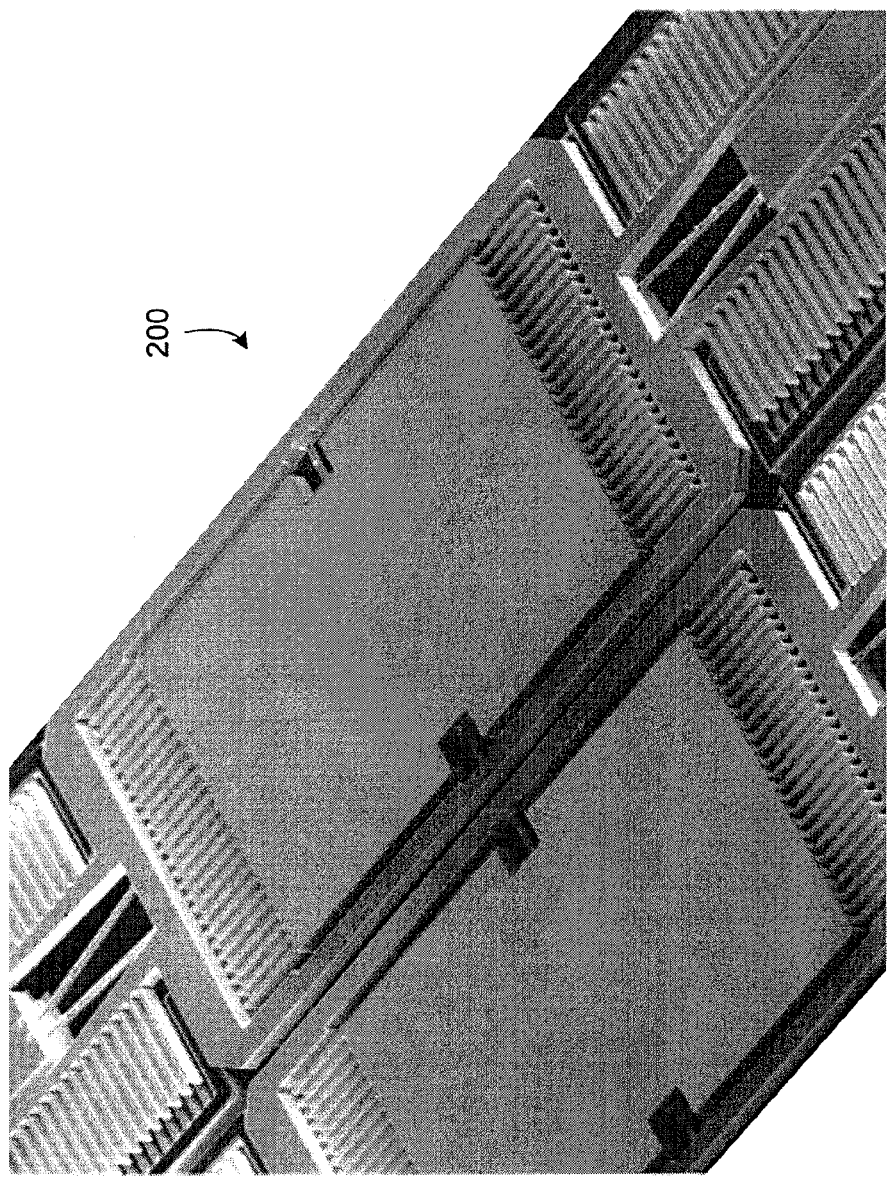
FIG. 21 is a magnified top isometric view of the array of FIG. 20.

FIG. 20 is a top view of an array 200 of multiple MEMS mirror structures manufactured from SOI wafers according to a method of the invention as previously described. This figure illustrates the adjacent formation of multiple MEMS mirror segments 30 on a single stack of wafers, arranged into an array of x-y gimbaled comb-driven mirrors for switching complex optical signals. FIG. 21 is a magnified top isometric view of array 200.

Figure 22:
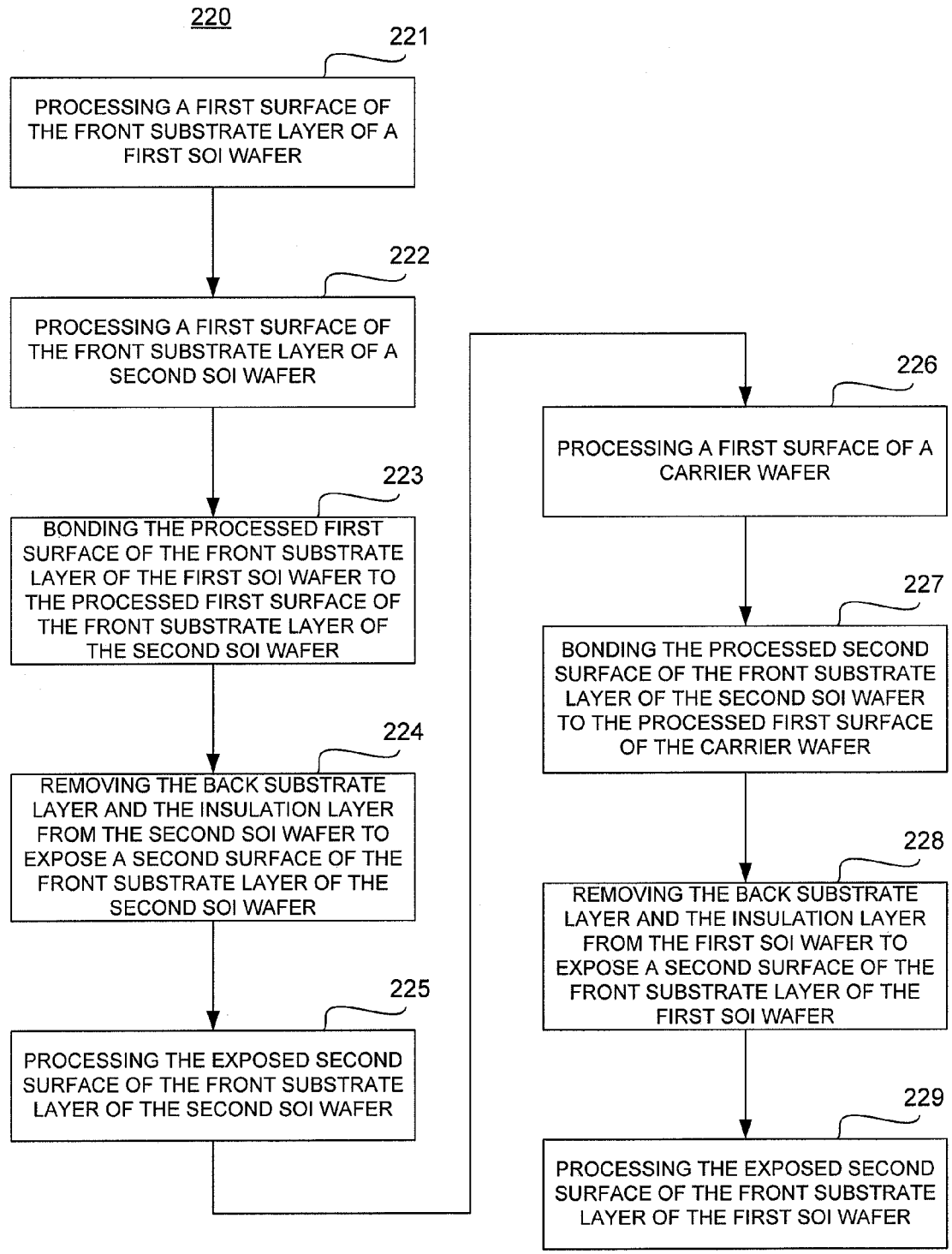
FIG. 22 is a process flow chart illustrating steps for wafer level manufacturing of a MEMS structure according to the invention.
Figure 23:
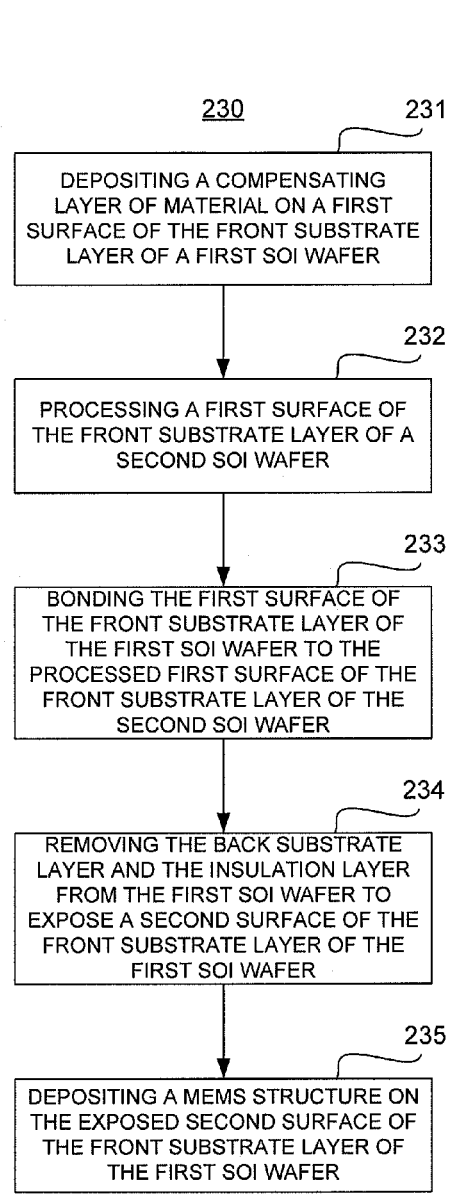
FIG. 23 is a process flow chart illustrating steps for manufacturing a stress compensation layer on a MEMS device using two SOI wafers according to the invention.
Figure 24:
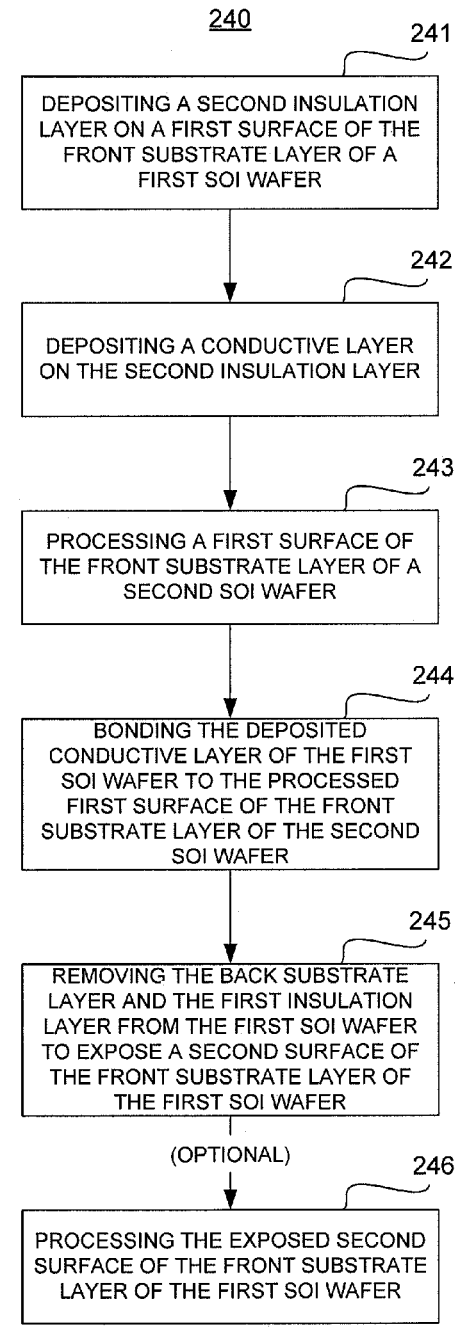
FIG. 24 is a process flow chart illustrating steps for manufacturing a conductive spring structure on a MEMS device using two SOI wafers according to the invention.

According to the foregoing, one skilled in the art will recognize that various wafer-level fabrication procedures for MEMS devices are possible within the scope of the invention. With reference to the various terminology employed herein, FIGS. 22-24 provide some exemplary embodiments of such fabrication processes. The SOI wafers processed in these methods may have front and back substrate layers separated by an insulation layer. Although two SOI wafers and a single carrier wafer are involved in these fabrication methods, other methods are possible that employ other combinations of SOI and carrier wafers.

FIG. 22 is a process flow chart illustrating steps in a method 220 for manufacturing a MEMS structure from SOI wafers according to the invention. The method starts at step 221, in which the front substrate layer of a first surface of an SOI wafer is processed. In the next step 222, which may be performed prior to, after, or concurrently with step 221, the front substrate layer of a first surface of a second SIO wafer is processed. The next step 223 is a bonding step in which the processed first surface of the front substrate layer of the first SOI wafer is bonded to the processed first surface of the front substrate layer of the second SOI wafer. Then, in step 224, both the back substrate layer and the insulation layer are removed from the second SOI wafer to expose a second surface of the front substrate layer of the second SOI wafer.

In the next step 225, the exposed second surface of the front substrate layer of the second SOI wafer is processed. Then in step 226, which may be performed prior to, concurrently with or after any or all of the foregoing steps, the first surface of a carrier wafer is processed. The next step 227 is another bonding step. In this step, the processed second surface of the front substrate layer of the second SOI wafer is bonded to the processed first surface of the carrier wafer. Then in step 228, both the back substrate layer and the insulation layer are removed from the first SOI wafer to expose a second surface of the front substrate layer of the first SOI wafer. In the final step 229, the exposed second surface of the front substrate layer of the first SOI wafer is processed.

FIG. 23 is a process flow chart illustrating steps in a method 230 for manufacturing a stress compensation layer on a MEMS device using SOI wafers according to the invention. Method 230 begins with step 231, in which a compensation layer of material (such as gold or other metal) is deposited on a first surface of a front substrate layer of a first SOI wafer. Next, in step 232, a first surface of a front substrate layer of a second SOI wafer is processed. Next, in step 233, the first surface of the front substrate layer of the first SOI wafer is bonded to the processed first surface of the front substrate layer of the second SOI wafer. In the next step 234, both the back substrate layer and the insulation layer are removed from the first SOI wafer to expose a second surface of the front substrate layer of the first SOI wafer. Lastly, in step 235, a MEMS structure is formed or deposited on the exposed second surface of the front substrate layer of the first SOI wafer.

FIG. 24 is a process flow chart illustrating steps in a method 240 for manufacturing a conductive spring structure on a MEMS device using SOI wafers according to the invention. Method 240 starts at step 241. In this initial step, a second insulation layer is deposited on a first surface of a front substrate layer of a first SOI wafer. In the next step 242, a conductive layer is deposited on the second insulation layer. In the next step 243, a first surface of the front substrate layer of a second SOI wafer is processed. In the next step 244, the deposited conductive layer of the first SOI wafer is bonded to the processed first surface of the front substrate layer of the second SOI wafer. Next, in step 245, both the back substrate layer and the first insulation layer are removed from the first SOI wafer to expose a second surface of the front substrate layer of the first SOI wafer. The final step 246 is an optional step in which the exposed second surface of the front substrate layer of the first SOI wafer is further processed.

Experimental Results

The DC scanning characteristics of micro-mirrors fabricated according to the invention were performance tested. A DC scan angle of ±5 (and ±0.7) mechanical degree was achieved in vertical (horizontal) directions at below 25V (and 50V). The dynamic responses were also measured. Resonance frequencies were observed at about 762 Hz in vertical tilting and at about 3.975 kHz in horizontal tilting. The radius of curvature for the mirror was found to be about 1.6 m. The surface roughness was measured to be about 18 nm.

The present invention demonstrates that a high performance dual-axis micro-mirror design is achievable using a combination of device layer transfer, patterning, and metal-to-metal bonding processes. High resonant frequency, large scan angle and low operating voltage are achieved. MEMS mirror arrays may be fabricated using these methods into 8×8 and 16×16 element OXC modules. The total insertion loss of this design is expected to lie in the 0.5 to 1 db range.

Exemplary embodiments of the invention have been disclosed in an illustrative style. Accordingly, the terminology employed throughout should be read in an exemplary rather than a limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A method of manufacturing a MEMS structure from SOI wafers, each SOI wafer having front and back substrate layers separated by an insulation layer, the method comprising the following steps:
   (a) processing a first surface of the front substrate layer of a first SOI wafer;
   (b) processing a first surface of the front substrate layer of a second SOI wafer;
   (c) bonding the processed first surface of the front substrate layer of the first SOI wafer to the processed first surface of the front substrate layer of the second SOI wafer;
   (d) removing the back substrate layer and the insulation layer from the second SOI wafer to expose a second surface of the front substrate layer of the second SOI wafer;
   (e) processing the exposed second surface of the front substrate layer of the second SOI wafer;
   (f) processing a first surface of a carrier wafer;
   (g) bonding the processed second surface of the front substrate layer of the second SOI wafer to the processed first surface of the carrier wafer;
   (h) removing the back substrate layer and the insulation layer from the first SOI wafer to expose a second surface of the front substrate layer of the first SOI wafer; and
   (i) processing the exposed second surface of the front substrate layer of the first SOI wafer.

2. The method of claim 1 wherein step (a) further comprises depositing a layer of insulation and patterning on the first surface of the front substrate layer of the first SOI wafer.

3. The method of claim 2 wherein step (a) further comprises depositing a conductive layer on the deposited layer of insulation.

4. The method of claim 3 wherein step (a) further comprises depositing one or more bonding pads on the deposited conductive layer.

5. The method of claim 1 wherein step (a) further comprises depositing a stress compensation layer on the first surface of the front substrate layer of the first SOI wafer.

6. The method of claim 1 wherein step (b) further comprises depositing a conductive layer and patterning on the first surface of the front substrate layer of the second SOI wafer.

7. The method of claim 6 wherein step (b) further comprises depositing one or more bonding pads on the deposited conductive layer.

8. The method of claim 7 wherein step (b) further comprises etching the first surface of the front substrate layer of a second SOI wafer.

9. The method of claim 1 wherein step (b) further comprises depositing a conductive layer and patterning on the second surface of the front substrate layer of the second SOI wafer.

10. The method of claim 9 wherein step (e) further comprises etching the second surface of the front substrate layer of the second SOI wafer.

11. The method of claim 1 wherein step (f) further comprises depositing an insulation layer and patterning on the first surface of the carrier wafer.

12. The method of claim 1 wherein step (f) further comprises depositing a conductive layer and patterning on the first surface of the carrier wafer.

13. The method of claim 11 wherein step (f) further comprises etching the first surface of the carrier wafer.

14. The method of claim 1 wherein step (i) further comprises etching the second surface of the front substrate layer of the first SOI wafer to multiple depths.

* * * * *